US006982689B2

(12) United States Patent
Hoshi et al.

(10) Patent No.: US 6,982,689 B2
(45) Date of Patent: Jan. 3, 2006

(54) LIGHT-EMITTING ELEMENT DRIVE APPARATUS

(75) Inventors: Tsukasa Hoshi, Sendai (JP); Hiroshi Sakamoto, Tokyo (JP)

(73) Assignee: Freescale Semiconductor, INC, Austin, TX (US)

( * ) Notice: Subject to any disclaimer, the term of this patent is extended or adjusted under 35 U.S.C. 154(b) by 383 days.

(21) Appl. No.: 10/443,376

(22) Filed: May 22, 2003

(65) Prior Publication Data

US 2003/0218585 A1    Nov. 27, 2003

(30) Foreign Application Priority Data

May 24, 2002    (JP)    ............................. 2002-151263

(51) Int. Cl.
    *G09G 3/34*    (2006.01)
(52) U.S. Cl. .......................................... 345/84; 345/82
(58) Field of Classification Search ............ 345/76–84, 345/204–207
    See application file for complete search history.

(56) References Cited

U.S. PATENT DOCUMENTS

| | | | |
|---|---|---|---|
| 4,561,915 A | 12/1985 | Mito | |
| 4,728,188 A | 3/1988 | Kitagawa et al. | |
| 4,812,642 A * | 3/1989 | Hasegawa et al. | .......... 250/221 |
| 5,073,838 A | 12/1991 | Ames | |
| 5,438,579 A | 8/1995 | Eda et al. | |
| 5,754,574 A | 5/1998 | Lofthouse Zeis et al. | |
| 5,812,575 A | 9/1998 | Choi | |
| 5,844,928 A | 12/1998 | Shastri et al. | |
| 6,195,371 B1 | 2/2001 | Haneda et al. | |
| 6,265,929 B1 | 7/2001 | Hauser | |
| 6,291,813 B1 | 9/2001 | Ackerman et al. | |
| 6,359,918 B1 | 3/2002 | Bielas | |
| 6,400,737 B1 | 6/2002 | Broutin et al. | |
| 6,516,010 B1 | 2/2003 | Broutin et al. | |
| 6,646,654 B2 * | 11/2003 | Takagi | ........................ 345/690 |
| 6,697,388 B1 | 2/2004 | Broutin et al. | |
| 6,801,557 B2 | 10/2004 | Liu | |
| 6,807,206 B2 | 10/2004 | Tsukiji et al. | |
| 2002/0044008 A1 | 4/2002 | Kawai | |

FOREIGN PATENT DOCUMENTS

| | | |
|---|---|---|
| EP | 0 431 832 | 6/1991 |
| EP | 0 793 316 | 9/1997 |
| JP | 02 265762 | 10/1990 |

(Continued)

*Primary Examiner*—Regina Liang
*Assistant Examiner*—Duc Q Dinh
(74) *Attorney, Agent, or Firm*—Charles Bergere (57) ABSTRACT

A light-emitting element drive apparatus for achieving light-emission control of a light-emitting element with high speed and high accuracy includes a monitoring photodiode 11 that receives light emitted from a laser diode 12 to generate a current, Im, that corresponds to the optical output thereof. The current Im is converted to a monitor voltage Vm by a current-to-voltage conversion circuit 13, and its waveform is smoothed by a first low-pass filter 14 to produce a monitoring average value Vav that has a ripple component. A pre-modulated optical power setup voltage Vps generated by a variable direct-current voltage source 25 is modulated by a pulse modulation circuit 22 based on a data signal delayed by a predetermined time, and smoothed via a second low-pass filter 23 and a third low-pass filter 24. Then, an optical power setup voltage Vref that has a nearly similar amplitude and ripple component is generated in synchronization with the average value Vav.

7 Claims, 6 Drawing Sheets

FOREIGN PATENT DOCUMENTS

| | | |
|---|---|---|
| JP | 6 120809 | 4/1994 |
| JP | 0921 4043 | 8/1997 |
| JP | 2000041002 | 2/2000 |
| WO | WO 00/01046 | 1/2000 |

* cited by examiner

LIGHT-EMITTING ELEMENT DRIVE APPARATUS

BACKGROUND OF THE INVENTION

The present invention relates to light-emitting element drive apparatus.

Optical modulation of a digital signal by a laser diode conventionally uses a direct modulation scheme where modulation is performed by on/off of a drive current.

Figure 4:
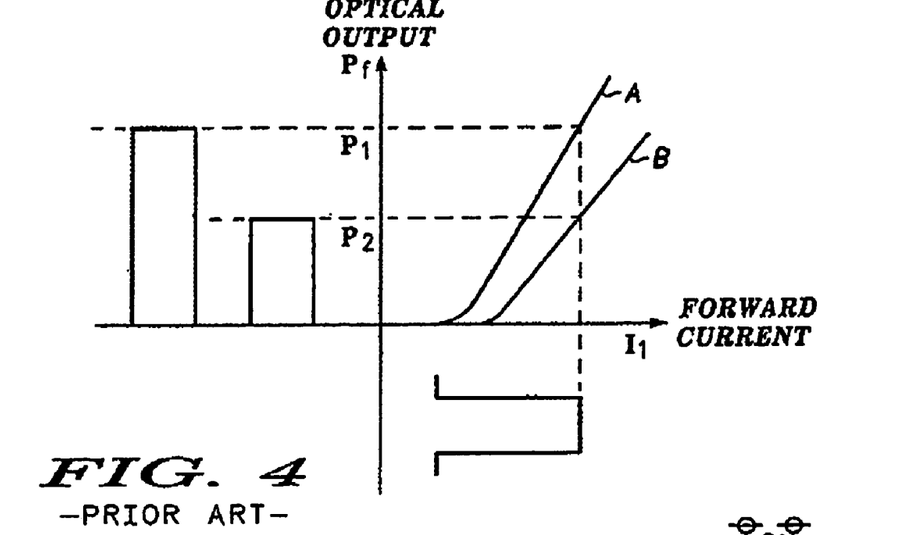
FIG. 4 is a characteristic diagram for explaining the relationship of the optical output relative to the forward current at low and high temperatures of the laser diode.

FIG. 4 shows an optical output pf vs. forward current If of a laser diode. The optical output pf increases nearly in proportion to the current after the threshold current Ith where light emission starts. The optical output characteristics are strongly dependent upon temperature. Generally, to keep the optical output pf constant, more forward current If is required at higher temperatures.

FIG. 4 also shows a difference in the optical output waveform depending upon temperature, where the forward current If is kept constant during direct modulation. Curve A denotes an optical output vs. forward current characteristic curve for a laser diode at low temperature. Curve B represents an optical output vs. forward current characteristic curve for a laser diode at high temperature. As shown, if the forward current If is kept constant (=I1), there are significant deviations between the optical output pf at low temperature (=P1) and the optical output pf at high temperature (=P2). In addition to temperature-dependent variations in characteristics, decreases in the optical output pf due to degradation over time (aging) also raise a problem. Generally, in order to compensate for the afore-described temperature-dependent changes and variations in the optical output pf due to degradation over time and thereby achieve a constant optical output pf, the forward current If of the laser diode is typically controlled by an automatic power control (APC) circuit.

The optical output pf of the laser diode may be monitored by a current output of a monitoring photodiode (MPD) bundled with a laser diode module. More specifically, the monitoring photodiode outputs a current (monitor current Im) that is proportional to the optical input from the laser diode, and is also less dependent upon temperature. Thus, based on the monitor current Im of the monitoring photodiode, the forward current If of the laser diode is feedback controlled.

Meanwhile, as methods for detecting the monitor current Im, peak detection and average-value detection are mainly available. The monitor current Im is converted to a voltage value Vm by a resistive load before it is detected. Then, peak detection is performed by monitoring high levels of the voltage waveform. Thus, with peak detection, its detection accuracy is substantially affected by the waveform quality of the voltage value Vm. In other words, peak detection requires a high-speed sample-and-hold circuit as the transmission rate increases. Additionally, the waveform of the voltage Vm is muted by influences of the terminal capacitance of the monitoring photodiode and the input terminal capacitance of the laser diode drive circuit. Accordingly, peak detection seems impracticable for detection with high accuracy.

On the other hand, average-value detection smoothes the waveform of the voltage Vm, which is handled as an average value, so that it is easy to operate. As a result, as a method for detecting the monitor current Im, average-value detection is mainly used.

Figure 5:
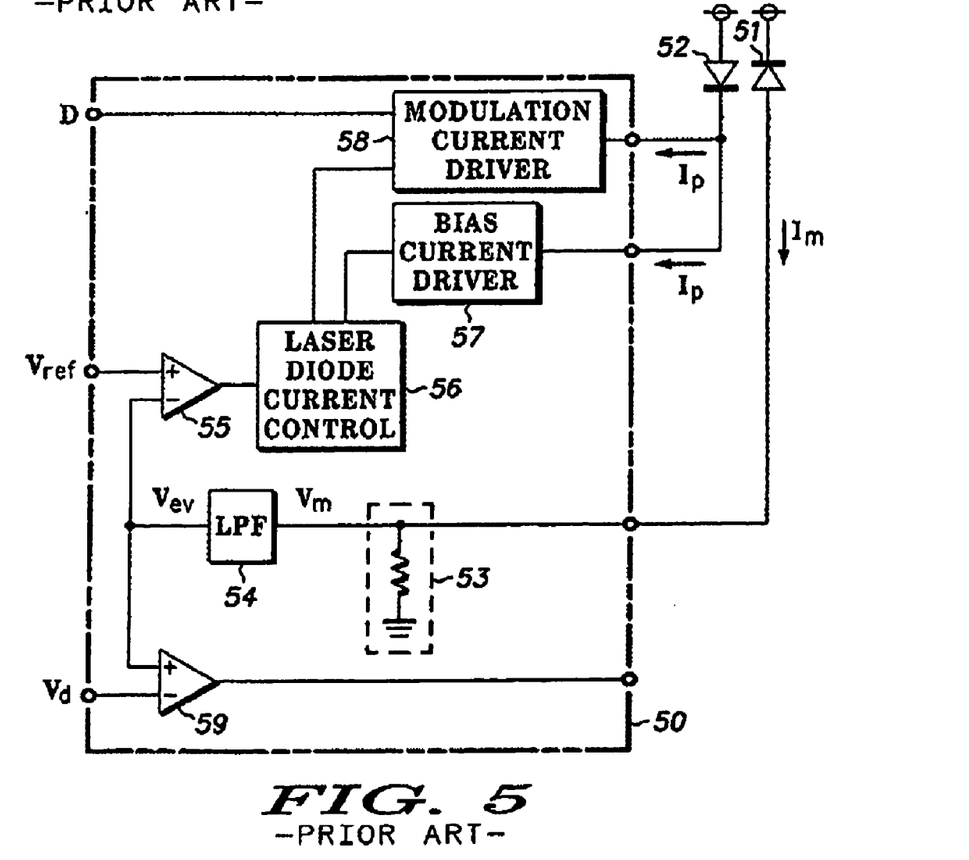
FIG. 5 is an electrical block circuit diagram of a prior art laser diode drive apparatus.
Figure 6:
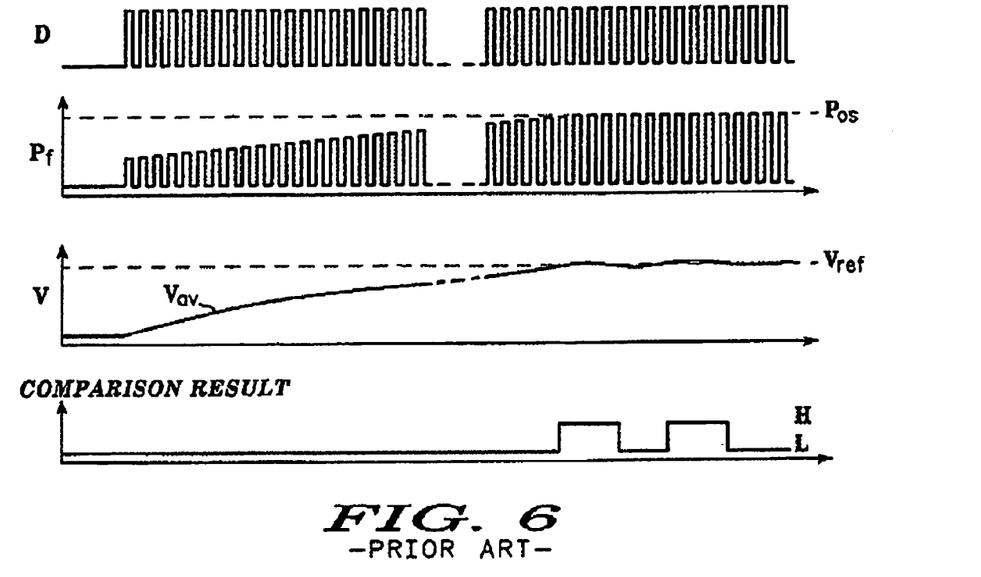
FIG. 6 shows a timing chart relative to a continuous data signal in the prior art laser diode drive apparatus.

FIG. 5 shows one example of an automatic power control (APC) circuit 50 that uses a prior art average-value detection scheme. A monitoring photodiode 51 receives light of a laser diode 52 and outputs a monitor current Im that corresponds to the received optical output pf. The monitor current Im of the monitoring photodiode 51 is output to a current-to-voltage conversion circuit 53. The current-to-voltage conversion circuit 53 converts it to a voltage value Vm that corresponds to the current value of the monitor current Im, and the resulting voltage value Vm is output to a low-pass filter (LPF) 54. The low-pass filter 54 smoothes the voltage value Vm. The low-pass filter 54 then outputs the smoothed voltage value Vm to a comparison circuit 55 as a monitoring photodiode average-value signal Vav (hereinafter referred to simply as "monitoring average value"). The comparison circuit 55, which includes a comparator, operational amplifier, and so forth, inputs said monitoring average value Vav, as well as a pre-set optical power setup voltage Vref. The comparison circuit 55 compares the monitoring average value Vav and optical power setup voltage Vref, and outputs the comparison result to a laser diode current control circuit 56.

The laser diode current control circuit 56 (hereinafter referred to simply as "current control circuit") inputs the comparison result, and controls a bias current drive circuit 57 and a modulation current drive circuit 58 based on the comparison result, thereby increasing or decreasing the bias current Ib or modulation current Ip, or both.

The bias current drive circuit 57 controls the current amount (level value) of the bias current Ib of the laser diode 52 in accordance with the control signal from the current control circuit 56 that is based on the comparison result. The modulation current drive circuit 58 inputs the data signal D, and outputs the modulation current Ip to the laser diode 52 in response to the data signal D. The modulation current drive circuit 58 controls the current amount (level value) of the modulation current Ip in accordance with the control signal from the current control circuit 56.

In other words, the laser diode 52 is feedback-controlled so that optimum optical output pf is achieved. Furthermore, if the laser diode 52 degrades over time so that it is out of compensation range for the optical output pf at the APC circuit 50, an optical degradation alarm is typically generated. Thus, the APC circuit 50 includes a second comparison circuit 59.

The second comparison circuit 59 inputs the monitoring average value Vav, as well as a pre-set optical power degradation setup voltage Vd. The second comparison circuit 59 compares the monitoring average value Vav and optical power degradation setup voltage Vd. Then, if the monitoring average value Vav falls below the optical power degradation setup voltage Vd, the second comparison circuit 59 outputs a drive signal for driving an alarm device, which is not shown.

With the prior art APC circuit 50, because it is set up with a direct-current value, a ripple component in the monitoring average value Vav is related directly to an error relative to the setup value that sets up the optical output pf of the laser diode 52. Thus, in order to minimize the ripple component of the monitoring average value Vav, the time constant of the low-pass filter 54 used for smoothing is set at relatively large values. However, if the time constant of the low-pass filter 54 is set at relatively large values, although its convergence accuracy would be high, the convergence time until the desired optical output Pos is attained becomes longer.

Furthermore, because the average value is handled, it is presumed that the signal input is always available and that the probability (mark rate) of "0" and "1" for the data signal D is assured to be ½. That is, the prior art method might be said to be suitable for continuous data where high convergence accuracy is more important than high speed of convergence time, such as SDH/SONET (Synchronous Digital Hierarchy/Synchronous Optical Network).

On the other hand, for a burst-type signal, which is typically represented by an upstream signal of ATM-PON (Asynchronous Transfer Mode—Passive Optical Network), convergence of the APC circuit is required at extremely short time. With ATM-PON recommended by ITU-TG983.1, a single burst cell is within about 2.4 $\mu$sec.

Figure 7:
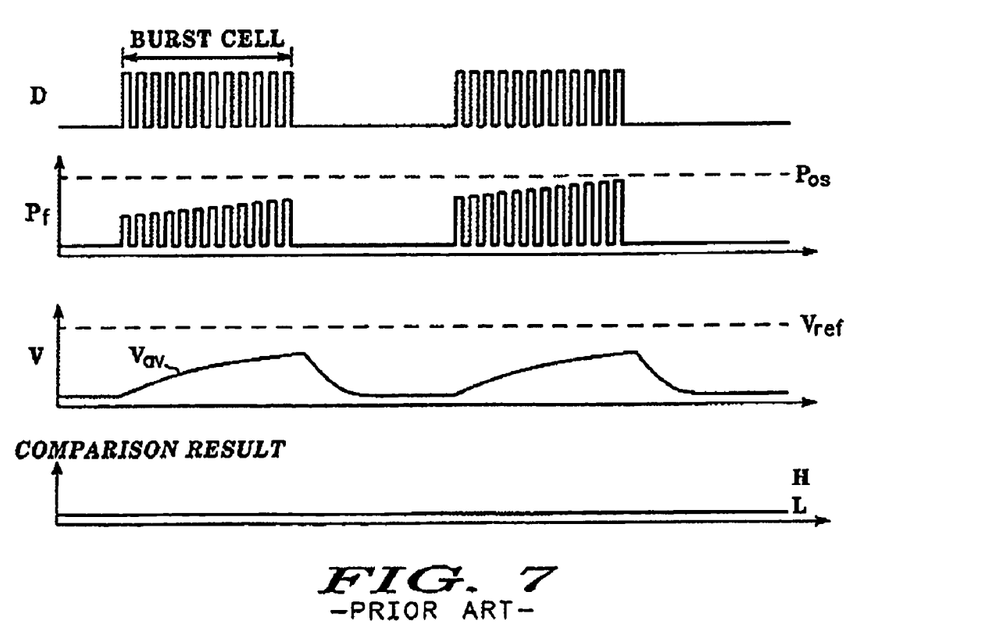
FIG. 7 shows a timing chart relative to a burst signal at the time when the time constant is increased in the prior art laser diode drive apparatus.

As shown in FIG. 7, if automatic power control is performed while the time constant of the low-pass filter 54 remains long as in the prior art, the monitoring average value Vav could not converge to an average-value level that should be reached within a single burst cell. Thus, it is difficult to achieve convergence of automatic power control within a single burst cell.

Figure 8:
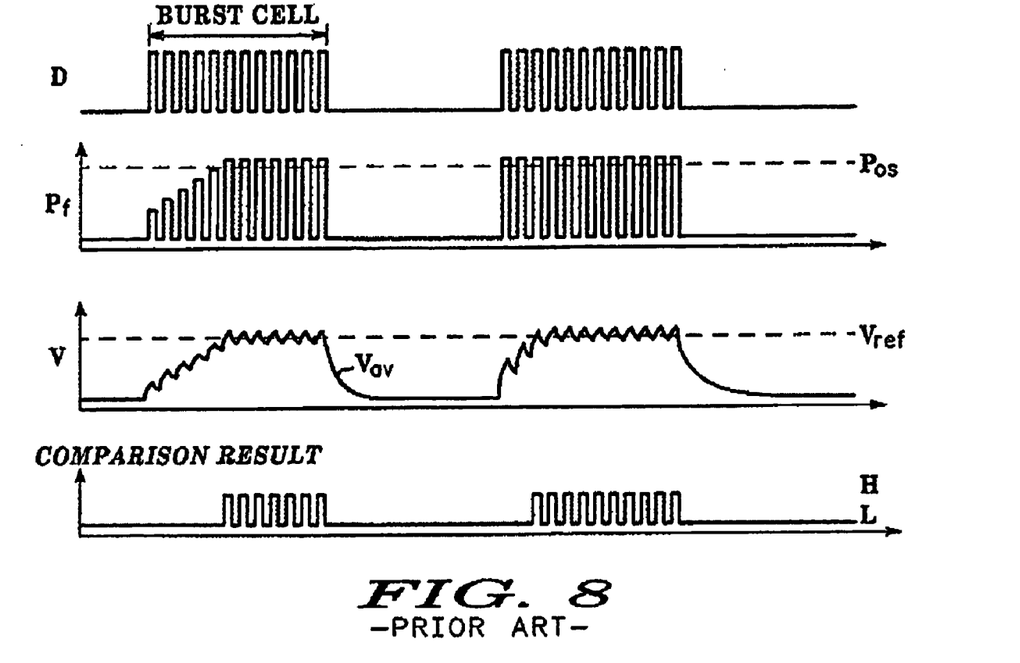
FIG. 8 is a timing diagram where the time constant is reduced in the prior art laser diode drive apparatus and where different symbols of the data signal appear alternatively.

In order to accommodate a burst signal, it is necessary to reduce the convergence time of automatic power control. Accordingly, if the time constant of the low-pass filter 54 is reduced, the monitoring average value Vav could be allowed to reach approximately at the optical power setup voltage Vref within a single burst cell. FIG. 8 shows a timing chart of the APC circuit 50 where the time constant of the low-pass filter 54 is reduced. As is clear from FIG. 8, although the response speed might be increased, the ripple component is not removed completely, so that an error occurs in the convergence value according to the amplitude of the ripple. This error is also strongly dependent upon the pattern of the data signal D; as shown in FIG. 8, if "1" and "0" appear alternatively, the amplitude of the ripple is relatively small.

Figure 9:
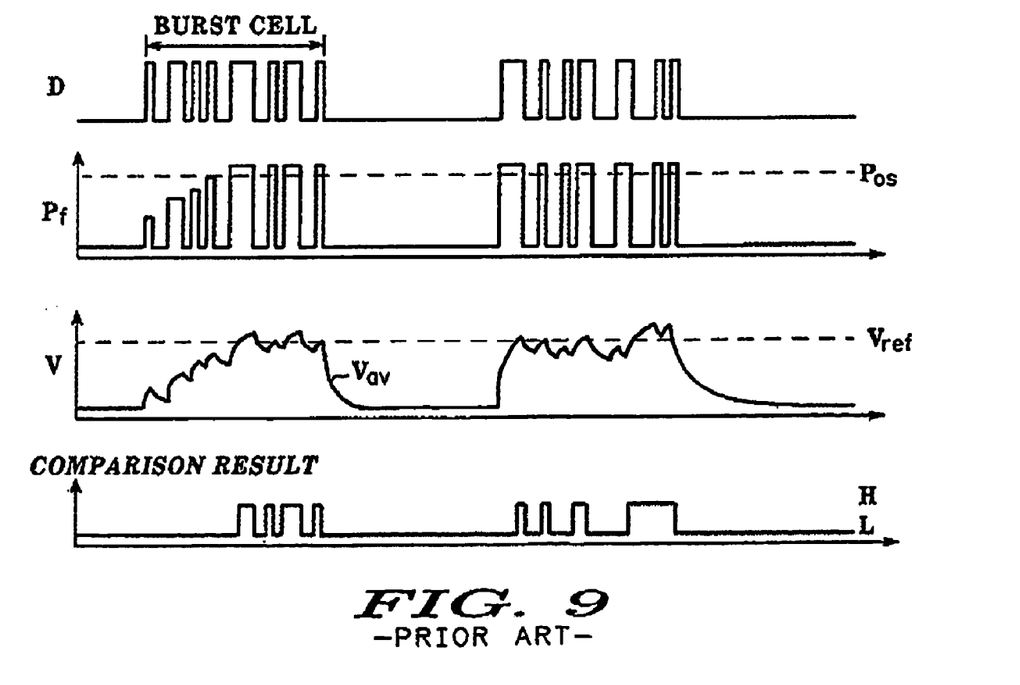
FIG. 9 is a timing diagram where the time constant is reduced in the prior art laser diode drive apparatus and where the same symbol of the data signal appears continuously.

However, if the data signal is such that values of the same symbol appear continuously, as shown in FIG. 9, the ripple becomes large, so that the error of the convergence value tends to increase accordingly. In this way, with the prior art scheme, it is difficult to achieve automatic power control with high speed and high convergence accuracy.

Additionally, with degradation detection of a burst-type data for the laser diode 52, a similar problem occurs. That is, if the time constant of the low-pass filter 54 is increased, although the accuracy might be enhanced, degradation detection could not be implemented within a single burst cell. In contrast, if the time constant of the low-pass filter 54 is reduced to enhance the response speed, the ripple of the monitoring average value Vav increases, so that an alarm signal is often generated at times when the degradation level is not reached. As a result, when a burst-type signal is handled, the prior art degradation detection scheme is unsuitable.

The present invention is designed to solve the afore-described problems and to provide a light-emitting element drive apparatus that can provide increased convergence speed and improved convergence accuracy for the light-emitting output required during transmission of burst data, even when the time constant is set a little shorter.

SUMMARY OF THE INVENTION

In order to solve the afore-described problems, the invention provides a light-emitting element drive apparatus, comprising: a drive current generation circuit for outputting a drive current to a light-emitting element, the drive current causing the light-emitting element to emit light with a pre-determined optical output based on a data signal; a sensing light-receiving element for receiving light from the light-emitting element and outputting a sense signal that corresponds to the optical output thereof; a first filter for smoothing the sense signal; a comparison circuit for comparing the smoothed sense signal from the first filter and a pre-determined setup signal; and a control circuit for generating, based on a comparison result of the comparison circuit, a control signal that causes the drive current generation circuit to output a drive current such that the light-emitting element produces the pre-determined optical output. A setup signal generation circuit is included that waveform-shapes the setup signal so that it has the same ripple component as the smoothed sense signal, and outputs it to the comparison circuit in synchronization with the smoothed sense signal.

The invention further provides a level adjustment circuit for inputting a setup signal from the setup signal generation circuit and attenuating the setup signal to a pre-determined level to generate a light-emitting element degradation setup signal; and a second comparison circuit for comparing the light-emitting element degradation setup signal and the smoothed sense signal from the first filter to determine whether the light-emitting element has degraded.

The invention further provides the light-emitting element drive apparatus, wherein the setup signal generation circuit comprises: a delay circuit for delaying the data signal; and a waveform-shaping circuit for waveform-shaping the data signal delayed by the delay circuit so that it has the same ripple component as the smoothed sense signal.

The invention further provides a pulse modulation circuit for using the data signal to pulse-modulate a direct-current voltage that is pre-determined for level conversion of the data signal delayed by the delay circuit, and outputting the resulting pulse-modulated signal to the waveform-shaping circuit.

The invention further provides a level conversion circuit for converting the setup signal waveform-shaped by the waveform-shaping circuit to a predetermined level before outputting it to the comparison circuit.

The invention also provides the light-emitting element drive apparatus wherein the waveform-shaping circuit comprises: a second filter for muting the waveform of the delayed data signal in a similar manner to the waveform of the sense signal relative to the data signal before being inputted to the first filter; and a third filter for smoothing the delayed data signal waveform-shaped by the second filter, in a similar manner to the first filter that smoothes the sense signal.

The invention also provides a light-emitting element drive apparatus comprising: a drive current generation circuit for outputting a drive current to a light-emitting element, the drive current causing the light-emitting element to emit light with a pre-determined optical output based on a data signal; a sensing light-receiving element for receiving light from the light-emitting element and outputting a sense signal that corresponds to the optical output thereof; a first filter for smoothing the sense signal; and a second comparison circuit for comparing the smoothed sense signal from the first filter and a pre-determined setup signal to determine whether the light-emitting element has degraded or not. A setup signal generation circuit is included that waveform-shapes the setup signal so that it has the same ripple component as the smoothed sense signal, and outputs it to the second comparison circuit in synchronization with the smoothed sense signal.

The setup signal generation circuit waveform-shapes the setup signal that is inputted to the comparison circuit such that it has the same ripple component as the sense signal output from the first filter, and inputs the resulting setup signal to the comparison circuit in synchronization with the sense signal. As a result, the setup signal is input to the comparison circuit as a signal that accounts for the ripple component and delay of the sense signal. Thus, for the light-emitting element, light-emitting control with high speed and high accuracy can be achieved.

The light-emitting element degradation setup signal input to the second comparison circuit is generated by the level adjustment circuit such that the setup signal generated by the setup signal generation circuit is attenuated to a pre-determined level. As a result, the light-emitting element degradation setup signal is input to the second comparison circuit as a signal that accounts for the ripple component and delay of the sense signal. Thus, high-speed and high-accuracy light-emitting element degradation detection can be achieved, without providing additional special circuitry used only for degradation detection.

The setup signal input to the comparison circuit is generated such that the data signal delayed by the delay circuit is waveform-shaped so as to have the same ripple component as the delay signal smoothed by the waveform-shaping circuit.

The pulse modulation circuit uses the data signal to pulse modulate the pre-determined direct-current voltage, whereby the level of the setup signal output to the comparison circuit is set.

The level conversion circuit outputs the signal waveform-shaped by the waveform-shaping circuit to the comparison circuit as a setup signal after it is converted to a pre-determined level.

The setup signal is waveform-shaped by the second filter in a similar manner to the waveform of the detection signal before it is inputted to the first filter. Subsequently, the setup signal that is waveform-shaped by the second filter is then waveform-shaped by the third filter in a similar manner as said sense signal is smoothed by the first filter.

The light-emitting element degradation setup signal is inputted to the second comparison circuit as a signal that accounts for the ripple component and delay of the sense signal. Thus, degradation of the light-emitting element can be detected with high speed and high accuracy.

DETAILED DESCRIPTION OF THE INVENTION

Figure 1:
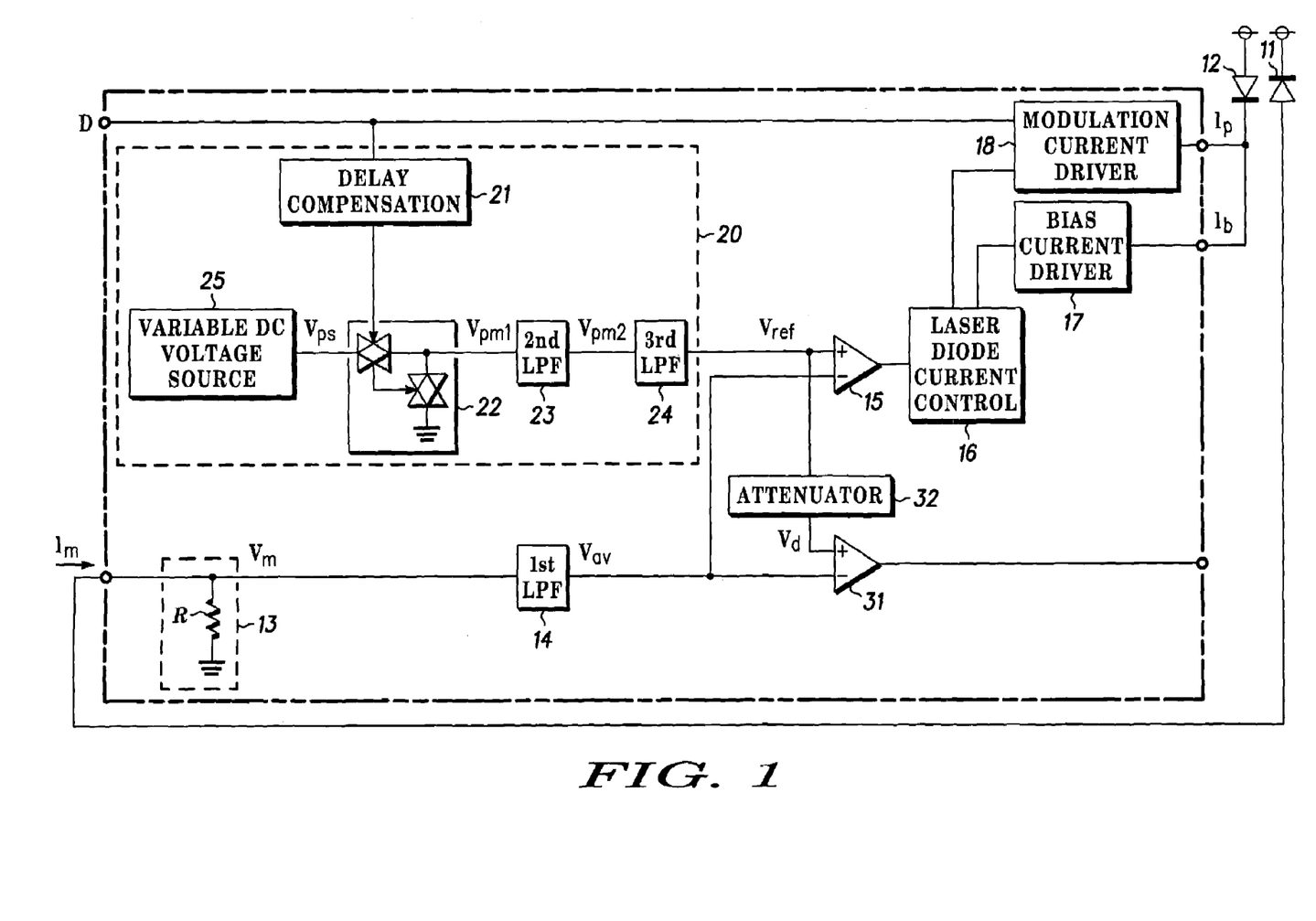
FIG. 1 is an electrical block circuit diagram of a laser diode drive apparatus that embodies the present invention.

Referring now to FIGS. 1 and 2, the present invention is described in detail below according to one embodiment thereof where it is embodied in a laser diode drive apparatus.

FIG. 1 shows an electrical block circuit diagram of a laser diode drive apparatus, where a monitoring photodiode 11 as a sensing light-receiving element receives light of a laser diode 12 as a light-emitting element, and outputs a monitor current Im that corresponds to the received optical output Pf. The monitor current Im of the monitoring photodiode 11 is output to a current-to-voltage conversion circuit 13. The current-to-voltage conversion circuit 13 includes a shunt resistor R, across which the monitor current Im is conducted, and outputs the resulting terminal voltage across the shunt resistor R to a first low-pass filter (LPF) 14 as a monitor voltage Vm. The first low-pass filter, as a first filter, smoothes the monitor voltage Vm. The low-pass filter 14 then outputs the smoothed monitor voltage Vm to a first comparison circuit 15 as a monitoring photodiode average-value signal (monitoring average value) Vav.

The first comparison circuit 15, which includes a comparator, an operational amplifier, and so forth, receives the monitoring average value Vav as a sense signal, as well as the optical power setup voltage Vref, which is input as a setup signal. The first comparison circuit 15 compares the monitoring average value Vav and optical power setup voltage Vref, and outputs the comparison result, as a control signal, to a laser diode current control circuit (current control circuit) 16.

The current control circuit 16 receives the comparison result, and outputs, based on the comparison result, a control signal to a bias current drive circuit 17 and modulation current drive circuit 18, respectively, that comprise a drive current generation circuit, thereby increasing or decreasing the bias current Ib or modulation current Ip, or both.

The bias current drive circuit 17 controls, in accordance with the control signal based on the comparison result from the current control circuit 16, the level value (current amount) of the bias current Ib as a light-emitting threshold current of the laser diode 12. The modulation current drive circuit 18 receives the data signal D, and outputs the modulation current IP to the laser diode 12 in response to the data signal D. The modulation current drive circuit 18 controls the level value (current amount) of the modulation current IP in accordance with the control signal based on the comparison result from the current control circuit 16. Thus, the sum of the bias current Ib and modulation current Ip is supplied as the drive current to the laser diode 12.

Next, the setup voltage generation circuit as the setup signal generation circuit that generates the optical power setup voltage Vref is described. The setup voltage generation circuit 20 includes a delay compensation circuit 21 as a delay circuit; a pulse modulation circuit 22; a second low-pass filter 23; a third low-pass filter 24; and a variable direct-current voltage source 25. The delay compensation circuit 21 receives the data signal D that is supplied to the modulation current drive circuit 18. The delay compensation circuit 21 delays the data signal D by a pre-determined delay time, before it is output to the next-stage pulse modulation circuit 22. The delay time is the time to compensate for the delay introduced in the modulation current drive circuit 18, laser diode 12, monitoring photodiode 11, and so forth, when the monitoring average value Vav is output from the first low-pass filter based on the data signal D. More specifically, it is the time when the timing of the optical power setup voltage Vref output from the third low-pass filter based on the data signal D coincides with the timing of the monitoring average value Vav being output from the first low-pass filter 14 based on the data signal D. Thus, the delay time at the delay compensation circuit 21 is determined in consideration of the delay times for the delay compensation circuit 21, pulse modulation circuit 22, second low-pass filter 23, and third low-pass filter 24.

The data signal D delayed at the delay compensation circuit 21 is output to the pulse modulation circuit 22. The pulse modulation circuit 22 receives the direct-current setup voltage Vps from the variable direct-current voltage source 25. The direct-current setup voltage Vps is a direct-current voltage that corresponds to the optical power setup voltage Vref as described in the explanation of the prior art, and is used to determine whether the optical output Pf of the laser diode has reached its desired optical output Pos, as compared to the monitor voltage Vm. The pulse modulation circuit 22 modulates the direct-current setup voltage Vps with the data signal D. That is, the direct-current setup voltage Vps is modulated by the pulse modulation circuit 22 to produce a post-modulation setup voltage Vpml shown in FIG. 2C, which has the same frequency component as the data D shown in FIG. 2A.

The post-modulation setup voltage Vpm1 is output to the second low-pass filter 23. The second low-pass filter 23 waveform-shapes the post-modulation setup voltage Vpml so that it is similar to the waveform of the monitor voltage Vm output from the current-to-voltage conversion circuit 13. More specifically, the monitor voltage Vm output from the current-to-voltage conversion circuit 13 has a voltage waveform that is muted depending upon circuit constants, such as parasitic capacitance and wire capacitance of the monitoring photodiode 11, parasitic capacitance of the current-to-voltage conversion circuit 13, and so forth. Thus, the second low-pass filter 23 is designed to waveform-shape the post-modulation setup voltage Vpml into a muted waveform that is similar to the monitor voltage Vm, with the same circuit constants.

The post-modulation setup voltage Vpml is waveform-shaped by the second low-pass filter 23 and output as a second post-modulation setup voltage Vpm2 to the third low-pass filter 24. The third low-pass filter 24 waveform-shapes the second post-modulation setup voltage Vpm2 under the same conditions as for the first low-pass filter 14, and outputs the resulting waveform-shaped signal as the optical power setup voltage Vref.

Figure 2A:
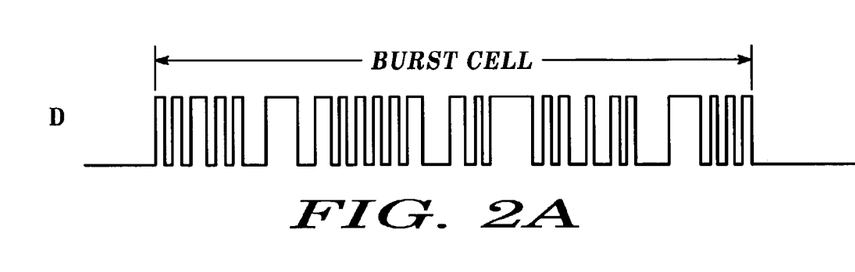
FIG. 2A is a waveform diagram of a data signal.
Figure 2B:
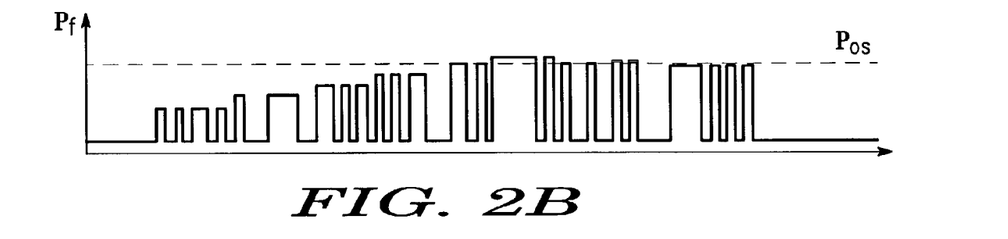
FIG. 2B is an optical output waveform diagram relative to the data signal.
Figure 2C:
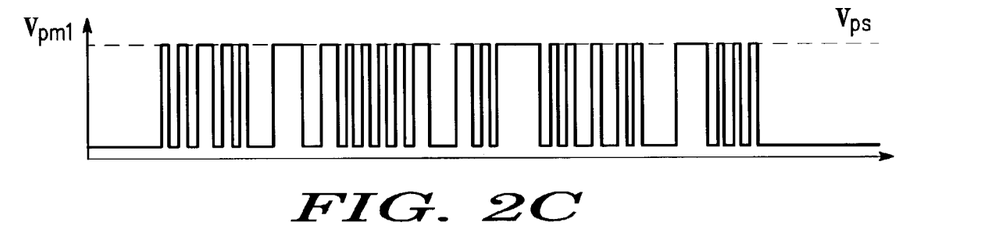
FIG. 2C is a waveform diagram of the post-modulated setup voltage.
Figure 2D:
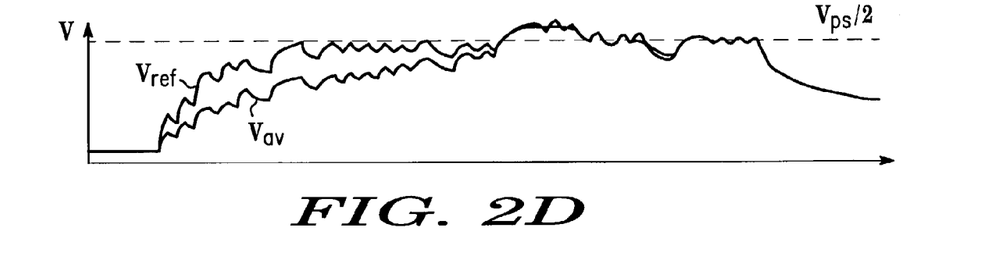
FIG. 2D shows waveform diagrams of the optical power setup voltage and monitoring average value.

Thus, the optical power setup voltage Vref has the same waveform, that is, ripple component, as the monitoring average value Vav, as shown in FIG. 2D. Furthermore, the delay compensation circuit 21 allows the optical power setup voltage Vref outputted from the third low-pass filter 24 based on the data signal D to be synchronized with the monitoring average value Vav output from the first low-pass filter 14.

Figure 2E:
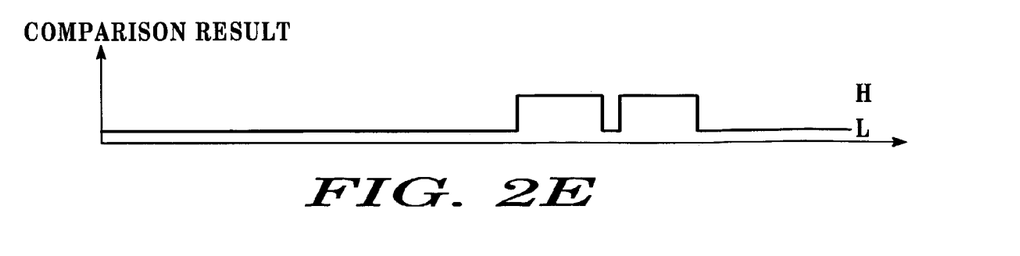
FIG. 2E is a waveform diagram of the sense signal for explaining the comparison results.

Accordingly, the first comparison circuit 15 can compare the monitoring average value Vav against the optical power setup voltage Vref that has the same ripple component as the monitoring average value Vav and is also synchronized therewith. As a result, the first comparison circuit 15 can achieve comparison with a high degree of accuracy, while minimizing the error due to the ripple component and the error due to the delay of the monitoring average value Vav. Furthermore, if the monitoring average value Vav exceeds the optical power setup voltage Vref, the first comparison circuit 15 outputs a sense signal to a H level (high potential), as shown in FIGS. 2D and 2E. In contrast, if the monitoring average value Vav falls below the optical power setup voltage Vref, the first comparison circuit 15 outputs a sense signal to a L level (low potential), as shown in FIGS. 2D and 2E.

Thus, the current control circuit 16 outputs a control signal to the bias current drive circuit 17 and modulation current drive circuit 18, respectively, in accordance with the comparison result of the first comparison circuit 15. That is, the current control circuit 16 generates and outputs a control signal for supplying a drive current (=IP+Ib) for the laser diode 12 such that the optical output Pf of the laser diode 12 reaches a desired optical output Pos. As a result, the laser diode 12 is controlled to emit light with the desired optical output Pos at all times.

The monitoring average value Vav from the first low-pass filter 14 is output to a second comparison circuit 31. The second comparison circuit 31 inputs the monitoring average value Vav, as well as inputting an optical power degradation setup voltage Vd from an attenuator 32 that serves as a level adjustment circuit. The attenuator 32 inputs the optical power setup voltage Vref generated by the setup voltage generation circuit 20, and generates the optical power degradation setup voltage Vd as a light-emitting element degradation setup signal. The attenuator 32 converts the optical power setup voltage Vref to a pre-determined lower level to generate an optical power degradation setup voltage Vd that has the same ripple component as the monitoring average voltage Vav. More specifically, the level conversion performed by the attenuator 32 is to convert the level to the monitoring average value Vav at the time when the laser diode 12 degrades as the optical output Pf relative to the drive current (=IP+Ib) of the laser diode 12 falls below a pre-determined light-emitting output.

Thus, the second comparison circuit 31 can compare the monitoring average value Vav against the optical power degradation setup voltage Vd that has the same ripple component as the monitoring average value Vav and is also synchronized therewith. Then, if the monitoring average value Vav falls below the optical power degradation setup voltage Vd, the second comparison circuit 31 outputs a H-level (high potential) drive signal for driving an alarm device, which is not shown.

Accordingly, if the laser diode 12 degrades so that its light emission is not controlled to its desired optical output Pos, and the optical output Pf falls below the optical power degradation setup voltage Vd, it is determined that the laser diode 12 has degraded.

The features of the laser diode drive apparatus so configured are described below. (1) In the present embodiment, the optical power setup voltage Vref generated by the setup voltage generation circuit 20 is provided as a waveform having the same ripple component as the monitoring average value Vav, and is also output to the first comparison circuit 15 in synchronization with the monitoring average value Vav. Then, in the first comparison circuit 15, the monitoring average value Vav is compared against the optical power setup voltage Vref that has the same ripple component as the monitoring average value Vav and is also synchronized therewith.

Thus, even if the time constant of the first low-pass filter 14 is reduced to increase the response speed, the first comparison circuit 15 can achieve comparison with high accuracy, while minimizing the error due to the ripple component and the error due to the delay in the monitoring average value Vav. As a result, light-emission control of the laser diode 12 can be achieved with high speed and high accuracy that are demanded for a burst-type data signal D.

(2) In the present embodiment, the optical power setup voltage Vref generated by the setup voltage generation circuit 20 is level-converted via the attenuator 32 before it is output to the second comparison circuit 31 as the optical power degradation setup voltage Vd. Then, the optical power degradation setup voltage Vd input to the second comparison circuit 31 provides a waveform that is synchronized with the monitoring average value Vav.

Thus, the second comparison circuit 31 can achieve comparison with high accuracy, while minimizing the error due to the ripple component and the error due to the delay in the monitoring average value Vav. As a result, degradation detection for the laser diode can be achieved with high response time and high accuracy that are demanded for a burst-type data signal D.

(3) In the present embodiment, the setup voltage generation circuit 20 is also used to generate the optical power degradation setup voltage Vd. That is, the need for providing a setup voltage generation circuit that is used only for degradation detection of the laser diode is eliminated by merely including the attenuator 32. Thus, the size of the circuitry as the drive apparatus can be reduced accordingly.

It should be appreciated that the embodiment of the present invention may also be modified as follows. The pulse modulation circuit 22 and variable direct-current voltage source 25 disposed prior to the waveform-shaping circuit having the second low-pass filter 23 and third low-pass filter 24 are used to adjust the level of the optical power setup voltage Vref that is inputted to the first comparison circuit 15. Instead, the waveform-shaped signal output from the waveform-shaping circuit having the second low-pass filter 23 and third low-pass filter 24 may be level-adjusted to output the resulting optical power setup voltage Vref to the first comparison circuit 15.

Figure 3:
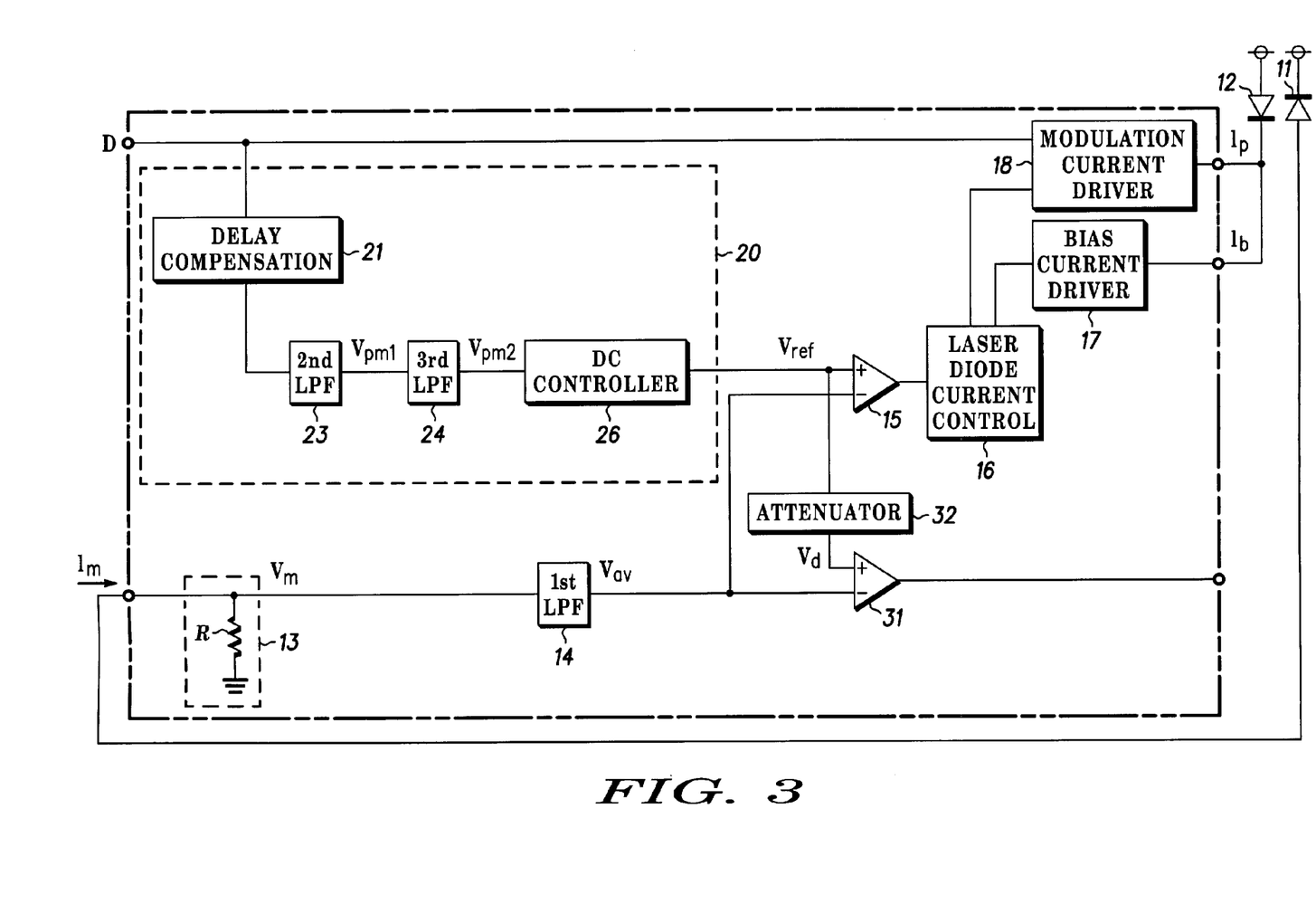
FIG. 3 is an electrical block circuit diagram of a laser diode drive apparatus for explaining another example of the present invention.

For example, the data signal that is delayed by the delay compensation circuit 21 is input to the waveform-shaping circuit having the second low-pass filter 23 and third low-pass filter 24, as shown in FIG. 3. The waveform-shaped second post-modulation setup voltage Vpm2 is then level-adjusted by a DC controller 26 that serves as a level conversion circuit having an attenuator and so forth, and the resulting level-adjusted signal is output to the first comparison circuit 15 as the optical power setup voltage Vref.

The optical power setup voltage Vref is also output to the attenuator 32. It is then level-converted at the attenuator 32 to produce an optical power degradation setup voltage Vd, which is output to the second comparison circuit 31.

In that case, light-emission control of the laser diode 12 can also be achieved with high speed and high accuracy, as well as degradation detection, in a similar manner to the afore-described embodiment. In addition, because the DC controller may merely be provided, as compared to the afore-described embodiment, the size of the circuitry as a drive apparatus can be further reduced.

The afore-described embodiment has been embodied in the drive apparatus for the laser diode 12 as a light-emitting element. It may also be applied to drive apparatuses for light-emitting diodes and other light-emitting elements. The afore-described embodiment has been embodied in the monitoring photodiode 11 as a light-receiving element. It may also be implemented by changing it to phototransistors and other light-receiving elements.

In the afore-described embodiment, the optical power degradation setup voltage Vd is generated by using the optical power setup voltage Vref for controlling the light emission of the laser diode 12 that is generated by the setup voltage generation circuit 20. Instead, it may also be implemented by providing a dedicated setup voltage generation circuit used only for the optical power degradation setup voltage Vd.

According to the invention described in claims 1 through 6, light-emission control for a light-emitting element can be achieved with high speed and high accuracy.

According to the invention described in claims 2 and 7, degradation detection for a light-emitting element can be accomplished with high speed and high accuracy.

What is claimed is:

1. A light-emitting element drive apparatus, comprising;
a drive current generation circuit for outputting a drive current to a light-emitting element, the drive current causing the light-emitting element to emit light with a predetermined optical output based on a data signal;
a sensing light-receiving element for receiving light from the light-emitting element and outputting a sense signal that corresponds to the optical output thereof;
a first filter for smoothing the sense signal;
a first comparison circuit for comparing the smoothed sense signal from the first filter and a pre-determined setup signal;
a control circuit for generating, based on a comparison result of the first comparison circuit, a control signal that causes the drive current generation circuit to output the drive current such that the light-emitting element produces the predetermined optical output;
a setup signal generation circuit that waveform-shapes the setup signal so that the setup signal has the same ripple component as the smoothed sense signal, and outputs the waveform shaped setup signal to the first comparison circuit in synchronization with the smoothed sense signal;
a level adjustment circuit for receiving the setup signal from the setup signal generation circuit and attenuating the setup signal to a pre-determined level to generate a light-emitting element degradation setup signal; and
a second comparison circuit for comparing the light-emitting element degradation setup signal and the smoothed sense signal from the first filter to determine whether the light-emitting element has degraded.

2. The light-emitting element drive apparatus according to claim 1, wherein the setup signal generation circuit comprises:
a delay circuit for delaying the data signal; and
a waveform-shaping circuit for waveform-shaping the data signal delayed by the delay circuit so that it has the same ripple component as the smoothed sense signal.

3. The light-emitting element drive apparatus according to claim 3, further comprising:
a pulse modulation circuit for using the data signal to pulse-modulate a direct-current voltage that is predetermined for level conversion of the data signal delayed by the delay circuit, and outputting the resulting pulse-modulated signal to the waveform-shaping circuit.

4. The light-emitting element drive apparatus according to claim 2, further comprising:
   a level conversion circuit for converting the setup signal waveform-shaped by the waveform-shaping circuit to a pre-determined level before outputting the converted setup signal to the comparison circuit.

5. The light-emitting element drive apparatus according to claim 2, wherein the waveform-shaping circuit comprises:
   a second filter for muting the waveform of the delayed data signal in a similar manner to the waveform of the sense signal relative to the data signal before being input to the first filter; and
   a third filter for smoothing the delayed data signal waveform-shaped by the second filter, in a similar manner to the first filter that smoothes the sense signal.

6. The light-emitting element drive apparatus according to claim 3, wherein the waveform-shaping circuit comprises:
   a second filter for muting the waveform of the delayed data signal in a similar manner to the waveform of the sense signal relative to the data signal before being input to the first filter; and
   a third filter for smoothing the delayed data signal waveform-shaped by the second filter, in a similar manner to the first filter that smoothes the sense signal.

7. The light-emitting element drive apparatus according to claim 4, wherein the waveform-shaping circuit comprises:
   a second filter for muting the waveform of the delayed data signal in a similar manner to the waveform of the sense signal relative to the data signal before being input to the first filter; and
   a third filter for smoothing the delayed data signal waveform-shaped by the second filter, in a similar manner to the first filter that smoothes the sense signal.

* * * * *